United States Patent [19]

Okamoto et al.

[11] Patent Number: 4,744,047
[45] Date of Patent: May 10, 1988

[54] PATTERN TEST APPARATUS INCLUDING A PLURALITY OF PATTERN GENERATORS

[75] Inventors: Keiichi Okamoto; Toshimitsu Hamada; Mineo Nomoto, all of Yokohama, Japan

[73] Assignee: Hitachi, Ltd., Tokyo, Japan

[21] Appl. No.: 793,219

[22] Filed: Oct. 31, 1985

[30] Foreign Application Priority Data

Nov. 1, 1984 [JP] Japan .................. 59-228983
Apr. 19, 1985 [JP] Japan .................. 60-82384

[51] Int. Cl.⁴ .............. G06F 11/00; G06F 15/70; G01R 31/28; G06K 9/00
[52] U.S. Cl. .................. 364/900; 364/518; 364/488; 364/491; 371/27; 340/747; 382/8
[58] Field of Search ... 364/200 MS File, 900 MS File, 364/518, 521, 488, 489, 490, 491; 340/747, 734; 371/27; 382/8

[56] References Cited

U.S. PATENT DOCUMENTS

| | | | |
|---|---|---|---|
| 4,013,832 | 3/1977 | Douglas | 340/723 |
| 4,498,079 | 2/1985 | Ghosh et al. | 340/721 |
| 4,538,232 | 8/1985 | Koyama | 364/491 |
| 4,584,573 | 4/1986 | Ito | 340/73 X |
| 4,614,941 | 9/1986 | Jarvis | 340/747 |
| 4,620,288 | 10/1986 | Welmers | 364/518 |
| 4,623,256 | 11/1986 | Ikenaga et al. | 382/8 X |
| 4,639,919 | 1/1987 | Chang et al. | 371/27 |
| 4,641,255 | 2/1987 | Hohmann | 340/734 |
| 4,644,584 | 2/1987 | Nagashima et al. | 382/8 X |

OTHER PUBLICATIONS

"An Automatic Visual Inspection System for LSI Photomasks" by K. Okamoto et al., IEEE Seventh International Conference on Pattern Recognition Proceedings, Jul. 30–Aug. 2, 1984, Montreal, Canada, pp. 1361–1364.

*Primary Examiner*—Raulfe B. Zache
*Assistant Examiner*—Thomas C. Lee
*Attorney, Agent, or Firm*—Antonelli, Terry & Wands

[57] ABSTRACT

An apparatus for testing printed wiring patterns for use in combination with an apparatus including a plurality of dedicated pattern generators for generating arcuate wiring patterns. In contrast to the conventional LSI pattern inspection effected with design data being inputted, the apparatus can inspect the pattern including curved portions peculiar to the printed wiring pattern. Although the conventional LSI inspection technique involves an impracticably increased amount of design data, the invention allows the test or inspection to be performed at a high speed with an improved reliability and can be applied to the inspection of any pattern including arcuate patterns. By inputting graphic data in conformance with the order for generating patterns, pattern generation can be accomplished not only through ordinary raster scan but also by other various scanning methods.

6 Claims, 11 Drawing Sheets

PATTERN TEST APPARATUS INCLUDING A PLURALITY OF PATTERN GENERATORS

BACKGROUND OF THE INVENTION

1. Field of the Invention

The present invention relates to an apparatus for inspecting patterns with reference to design data. More particularly, the invention concerns a pattern generating apparatus for generating reference patterns at a high speed on the basis of the design data.

2. Description of the Prior Art

Circuit patterns of LSI circuits or the like are commonly depicted or plotted by a plotting apparatus referred to as a pattern generator. This type of pattern generator operates based on the observation that a circuit pattern is constituted by a set of rectangular pattern elements of various sizes, such that a reticle is provided through irradiation of the individual rectangular pattern elements one by one.

Test or inspection of the circuit pattern thus plotted on the reticle is conducted through comparison of the pattern on the reticle under test with the design pattern serving as a reference pattern, as discussed, for example, in a Japanese periodical "Electronic Materials" Sept. 1983, pp. 38-51. The design pattern are electrically generated from data for test or inspection converted from data for driving a pattern generator for making it convenient to develop video signals. More specifically, the data for inspection or test is developed in a memory as a two-dimensional pattern to thereby generate the design pattern. On the other hand, a magnified image of the rectile to be inspected is converted into electric signals with the aid of an optoelectronic conversion device, the signals being developed on a memory in the similar manner. When a difference is found between the design pattern and the circuit pattern of the rectile developed on the memories as the result of comparison, it is determined that the rectile being inspected suffers a defect.

A method of generating the design pattern has heretofore been known, as disclosed in the Preparatory Paper For 16th SICE Lecture No. 2706 entitled "Graphic Pattern Generating Method" and Japanese Patent examined Publication No. 4709/1984. It should be mentioned that the pattern generator discussed in the lecture "Graphic Pattern Generating Method" was developed by the inventors of the present application.

These hitherto known pattern generating methods start with the recognition that the circuit pattern for LSI or the like is constituted only by rectangular pattern elements (subpatterns), wherein the rectangular subpatterns are generated on a two-dimensional plane on the basis of the apex coordinates of the rectangles. Application of this technique to the inspection or test of the circuit patterns of printed circuits will encounter a technical problem to be overcome, because such circuit pattern includes circular pattern elements and circular arc pattern elements in addition to the rectangular pattern elements. For plotting, for example, a circular pattern for a printed circuit, a circular aperture is magnified or contracted to appropriate size and optically projected for manufacturing a mask. On the other hand, in the case of the circular arc and linear patterns, circular or rectangular apertures are optically projected by using a numerically controlled machine to prepare the patterns. Such being the circumstances, generation of the circular arc patterns, circular patterns and acute angular patterns peculiar to the circuit pattern for the printed circuit board through the hitherto known techniques would require an enourmous amount of rectangular pattern elements, involving an increased memory capacity as well as an enlarged hardware scale to such extent that practical realization is rendered very difficult.

SUMMARY OF THE INVENTION

It is an object of the present invention to realize inspection or test of circuit patterns for printed circuits at a high speed with an improved reliability. To this end, it is also intended to make it possible to generate patterns of various configurations for printed circuits while reducing the amount of data to be processed and suppressing the amount of hardware.

In view of the above object, it is proposed according to an aspect of the invention that a plurality of patterns to be used repeatedly are registered in an image memory, and that the patterns are encoded based on the types of species thereof, wherein patterns are generated on a time-serial basis through a raster scan procedure from data including the pattern codes and the pattern coordinates arrayed in the order or sequence in which the patterns are generated.

More specifically, the pattern for the printed substrate is prepared by employing a plotting apparatus referred to as the photo-plotter. When a circular aperture is to be plotted with this apparatus, by way of example, an aperture of a corresponding shape is magnified or contracted to a suitable size and projected onto a mask to be prepared by using an optical system. A single substrate pattern is realized by a combination of several tens of types of aperture patterns. Thin lines such as signal lines included in the circuit pattern must be plotted by moving the projected circular or rectangular aperture in the X- and/or Y-direction. Accordingly, it is an object of the invention to make available reference patterns for pattern inspection by generating an aperture pattern from the design data.

According to another aspect of the invention, a graphic pattern to be plotted by moving the aperture pattern on and along a linear line or a circular arc is decomposed into at least three pattern elements, i.e. a first pattern element at the start position of the movement, a second pattern element at the end position of the movement and a third pattern element plotted during the movement, wherein these pattern elements are stored. For generating the graphic pattern, the decomposed or divided pattern elements are generated through a raster scan procedure in the order in which they were stored, and are synthesized into the graphic pattern.

BRIEF DESCRIPTION OF THE DRAWINGS

FIGS. 1 to 8 are views for illustrating a first aspect of the invention, in which:

FIG. 1 is a view showing a general arrangement of a pattern inspection or test apparatus to which the first embodiment of the invention is applied;

FIG. 2 is a view illustrating a typical pattern on a printed substrate;

FIG. 3 is a view for illustrating a method of plotting a pattern on a printed substrate;

FIG. 4 is a view for illustrating a format for describing pattern data;

FIG. 5 is a detailed view of FIG. 3;

FIG. 6 is a view illustrating pattern data corresponding to patterns shown in FIG. 5;

FIG. 7 is a view showing in detail a design pattern generator (7) shown in FIG. 1; and FIG. 8 is a view showing an embodiment for converting the pattern generating signal to a mask pattern signal.

FIGS. 9 to 18 are views for illustrating a second aspect of the present invention, in which:

FIG. 9 is a view showing a general arrangement of a pattern inspection apparatus to which a second embodiment of the invention may be applied;

FIG. 10 is a view for illustrating patterns on printed substrates;

FIG. 11 is a view for illustrating a method of generating patterns according to the second embodiment of the invention;

FIG. 12 is a view showing in detail a circuit arrangement of the design pattern generator shown in FIG. 9;

FIG. 13 is a view for illustrating the operation of the aperture pattern generator shown in FIG. 11 and a memory configuration therefor;

FIG. 14 is a circuit diagram showing in detail a structure of the aperture pattern generator shown in FIG. 12;

FIG. 15 is a view for illustrating generation of a rectangular pattern;

FIG. 16 is a circuit diagram showing in detail a structure of the rectangular pattern generator shown in FIG. 12;

FIG. 17 is a view for illustrating generation of a circular arc pattern; and

FIG. 18 is a view showing in detail a structure of the circular arc pattern generator.

DESCRIPTION OF THE PREFERRED EMBODIMENTS

Figure 1:
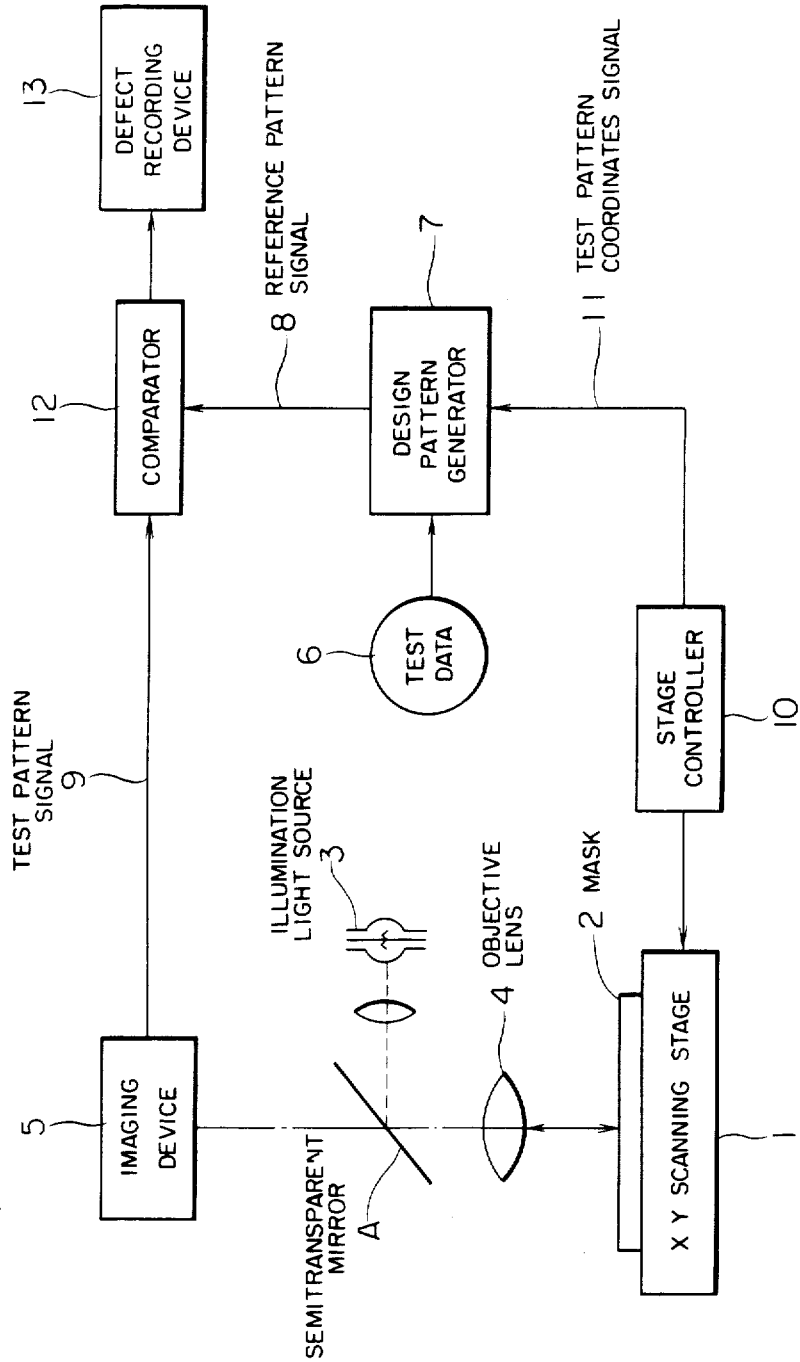

Initially, description will be provided for a general arrangement of a first pattern inspection or test apparatus to which the present invention can be applied, by referring to FIG. 1.

The apparatus is so arranged that a pattern of a mask 2 under test disposed on an XY-scanning stage 1 is illuminated with an illuminating light source 3 through a semitransparent mirror A, wherein a magnified image of the pattern is detected by an imaging device 5 through an objective lens 4. On the other hand, design data used in manufacturing the mask 2 under test are converted to test data of a format suited for the intended test. On the basis of the test data 6, a reference pattern signal 8 corresponding to the mask under test is generated by a design pattern generator 7. This reference pattern signal 8 corresponds to a test pattern signal 9 detected by the imaging device 5. Synchronization of both signals 8 and 9 is controlled by a test pattern coordinate signal 11 produced by a stage controller 10 so that misalignment is prevented from taking place. The test pattern signal 9 is compared with the reference pattern signal 8 through a comparator 12, wherin a decision is made as to the presence of a defect in accordance with a predetermined defect detecting algorithm. In the case where a defect is present, corresponding data is recorded in a defect recording device 13 to be utilized later in the process for eliminating or correcting the defect.

In particular, the present invention concerns the design pattern generator 7 of which the arrangement and operation thereof will be described below.

Figure 2:
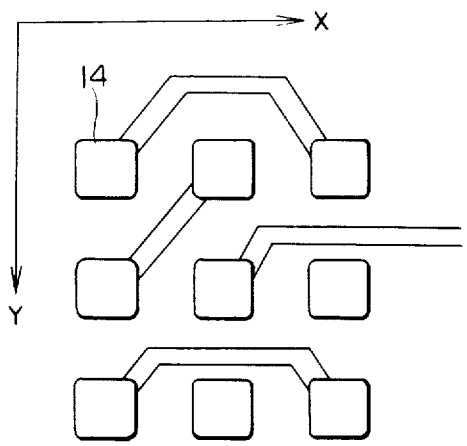

FIG. 2 is a view illustrating a portion of a substrate printed with a pattern composed of pads (electrode patterns) 14 located at lattice points with a constant distance or space between each pad.

Figure 3:
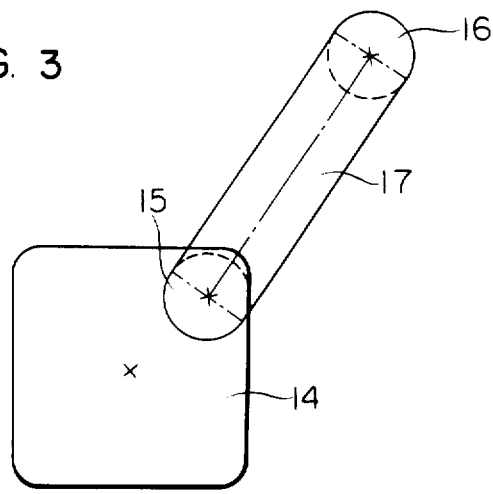

As shown in FIG. 2, the rightward direction is represented by the positive X-axis or direction of an XY-coordinate system while the positive Y-axis represents the downward direction. This plotted pattern may be composed of pattern components or elements (subpatterns) such as those illustrated in FIG. 3. More specifically, the pattern is constituted by a pad pattern 14, an interconnection-line start circle 15, an interconnection-line end circle 16 and an interconnection line segment forming rectangle 17.

For describing these pattern components or elements (also referred to simply as patterns), there can be used the following data. Namely, for the pad pattern 14, the start circle 15 and the end circle 16, codes indicating the types or species of these pattern components and coordinates (X, Y) thereof may be made use of, while the interconnection-line segment forming rectangle may be represented by a code indicative of the line segment and the coordinates of four apexes $(X_1, Y_1)$, $(X_2, Y_2)$, $(X_3, Y_3)$ and $(X_4, Y_4)$.

Figure 4:
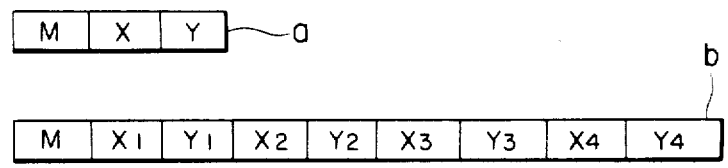

FIG. 4 is a view illustrating formats of the pattern data mentioned above. A format denoted by a is used for the data of the pattern whose geometrical configuration can be determined by the pattern type or species and the center position as in the case of the pad or circular pattern. On the other hand, the format b is for the pattern which requires data of four apexes as in the case of the rectangular pattern.

Now, description will be made on a process for generating patterns in synchronism with the detection of the test pattern on the basis of the data mentioned above.

Detection of a pattern is carried out through the imaging device 5 shown in FIG. 1 which may be constituted, for example, by a TV camera or a solid imaging device. In the following description, it is assumed that a one-dimensional sensor such as a CCD sensor is employed. Accordingly, two-dimensional scanning for obtaining the test pattern is realized by the scanning movement of the CCD sensor itself (in the X-direction) in combination with the movement of the XY-scanning stage 2 in the Y-direction.

Figures 5, 6:
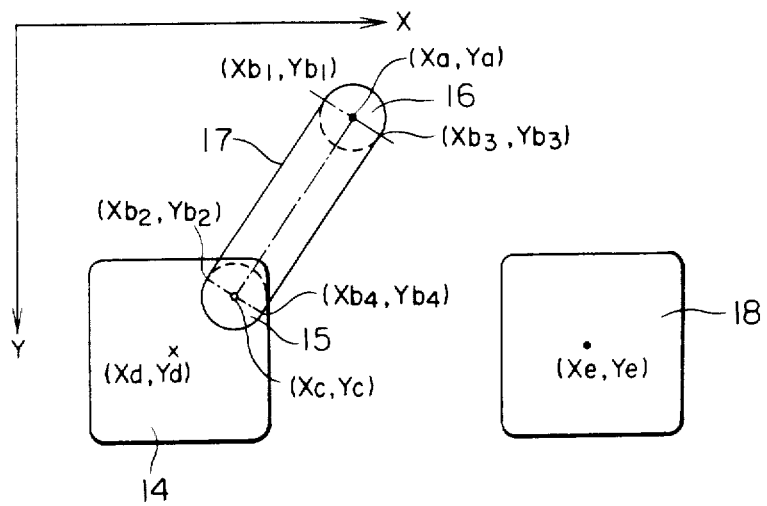

In other words, the pattern detection is carried out through a raster scan procedure. Since the design pattern has to be generated in synchronism with the pattern detection, generation of the design pattern must be effected through the raster scan. FIG. 5 illustrates a process of generating the design pattern in synchronism with the pattern detection through the raster scan. For simplification of description, it is assumed that the pattern under consideration is same as the one illustrated in FIG. 3.

Referring to FIG. 5, the scanning through the CCD sensor is performed along the X-axis from the left to the right simultaneously with the movement of the stage in the Y-direction. Data are previously arrayed in the order or sequence in which the associated patterns appear. In the case of the example illustrated in FIG. 5, data are arrayed in the order of the patterns 16, 17, 14 and 15. FIG. 6 illustrates a corresponding array of data formats.

It is further assumed that the circular pattern 16 (FIG. 5) is represented by a binary code "00", the rectangle is represented by a binary code "01", and the pad pattern 14 is represented by a binary code "10". On the other hand, the coordinates of the center of the circular pattern 16 is represented by "Xa, Ya", the four apexes of the rectangular pattern 17 are represented by the coordinates "Xb1, Yb1", "Xb2, Yb2", "Xb3, Yb3" and "Xb4, Yb4", respectively, the center of the circular pattern 15 is represented by "Xc, Yc", the center of the pad pattern 14 is represented by "Xd, Yd", and the center of a pad pattern 18 is given by "Xe, Ye".

Further, the test data 6 (FIG. 1) are sorted or classified and stored in a memory such as magnetic tape device, for example, in the order or sequence in which the corresponding patterns make appearance, as illustrated in FIG. 6. The test data are read out from the memory in the same order.

Next, a method of generating patterns on the basis of the data illustrated in FIG. 6 will be described in concrete.

First, generation of the circular pattern 16 (FIG. 5) will be considered. The pattern generator may be implemented in a circuit configuration shown in FIG. 7. Referring to the Figure, a numeral 19 denotes a computer, 20 denotes a pattern generation address register, 21 denotes an X-scan address counter, and 22 denotes a comparator for comparing the output value of the address registers 20 with that of the address counter 21. A numeral 23 denotes a column address counter, 24 denotes output column data derived from the circular pattern data 16 stored in the pattern memory 32, a numeral 25 denotes a shift register for parallel-to-serial conversion, 26 designates a load signal outputted from the comparator 22, refrence numeral 27 designates a shift clock signal, 28 designates a pattern signal outputted from the shift register 25, reference numeral 29a denotes an AND gate, 30 designates an X-scan start signal, 29b denotes an AND gate having one input applied with the X-scan start signal 30, reference numeral 32 denotes the pattern memory, and finally 33 designates an X-scan clock signal.

Figure 7:
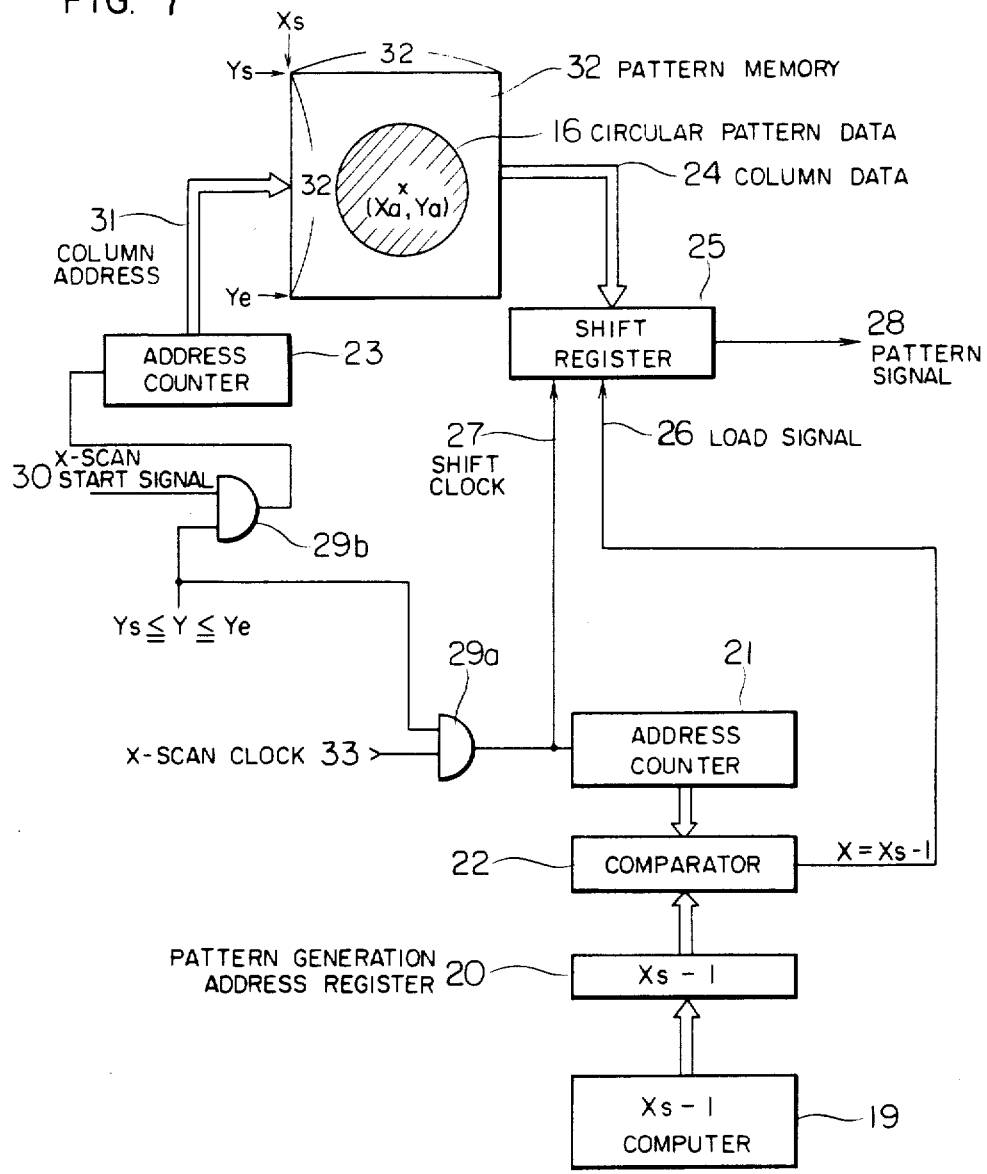

The circular pattern data 16 shown in FIG. 7 are previously stored in the pattern memory 32. For purposes of explanation, it is assumed that the circular pattern data 16 is a binary pattern consisting of $32 \times 32$ picture elements or pixels. On the basis of the center coordinates "Xa, Ya" of the pattern data 16, the upper left coordinates "Xs, Ys" of the pattern stored in the memory 32 and comprising $32 \times 32$ pixels can be arithmetically determined. Subsequentially, a calculation of "Xs-1" through the computer 19 is performed and the results of the calculation are stored in the pattern generation address register 20. The X-scan address can be obtained by counting the X-scan clock pulses 33 through the X-scan address counter 21. By way of example, when a linear sensor of 1024 bits is employed as the imaging device 5 (FIG. 1), the scan positions thereof are counted.

When the scanning in the Y-direction is effected in a pattern generating region, that is, $$Y_s \leq Y \leq Y_e$$

then, the address stored in the pattern generation address register 20 (FIG. 7) is compared with the value contained in the X-scan address counter 21 through the comparator 22. When the comparison results in a coincidence, the column data 24 consisting of 32 bits designated by the column address counter 23 is placed in the shift register 25 for parallel-to-serial conversion in response to the load signal 26 and outputted serially as the pattern signal 28 under the timing of the shift clock 27. When the scanning in the Y-direction takes place outside of the pattern generating region, that is, unless $$Y_s \leq Y \leq Y_e$$

then, the X-scan clock signal 33 is blocked by the gate 29a, resulting in that the pattern generation is inhibited. Every time the scan in the X-direction advances by one row, the X-scan start signal 30 produced at the start of the scanning in the X-direction and serving as the synchronizing signal causes the column address counter 23 of the pattern memory 32 to be incremented, whereby the column address is incremented by one, allowing the pattern of the next row to be generated through the procedure described above. When the scanning in the Y-direction takes place outside the region defined by $$Y_s \leq Y \leq Y_e$$

then, the counting operation of the column address counter 23 is inhibited by the gate 29b.

In the foregoing, generation of a single pattern has been described. As will be appreciated, in the case of this illustrative example, data of one row is generated once every time the scanning in the X-direction is carried out along one row. When the same pattern appears a number of times in the course of the single scanning as in the case of the patterns 14 and 18 shown in FIG. 5, a number of the pattern generation address registers may be incorporated in the pattern generator shown in FIG. 7 so that a corresponding number of loadings are made in the shift register 25. Pattern generation is regulated at a speed determined by the X-scan clock 33. Since the data are read out from the pattern memory 32 in parallel, generation of a maximum number of the same patterns juxtaposed closely to one another can be accomplished at a speed reduced by a factor of the number of the parallel outputs of the pattern memory 32.

For example, even when the X-scan clock signal 33 is 10 MHz, the reading of the pattern memory 32 can be effected at a rate of 10 MHz/32. In conjunction with the configuration of the pattern memory, it has been described as consisting of $32 \times 32 \times 1$ bits. It should however be self-explanatory that the pattern memory may be realized in any desired size or capacity.

Generation of the rectangular pattern can be realized by resorting to the hitherto known graphic pattern generating technique. Accordingly, further description thereof is unnecessary. In the above description of the illustrative embodiment, it has been assumed that the data for pattern generation are stored in a read-only memory. However, it will be readily understood that the memory for this purpose can be implemented in the form of RAM (random access memory). In that case, since requisite data may be written in the memory prior to the pattern generation, a single pattern generator can deal with generation of various patterns, whereby flexibility and versatility can be further improved.

Figure 8:
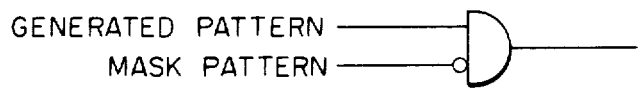

Although the description has been made in conjunction with the pattern generation, it will be understood that the teaching of the invention can be applied to formation of a mask pattern for masking those portions where no patterns should be generated. This can be accomplished simply by adding one gate, as illustrated in FIG. 8.

Next, description will be made on a general arrangement of a second pattern test or inspection apparatus to which the present invention can be applied, by referring to FIG. 9. The second test apparatus is characterized by high-speed operation and miniaturization when compared with the first test (inspection) apparatus described above and for this reason differs from the latter with regards to the general arrangement.

Figure 9:
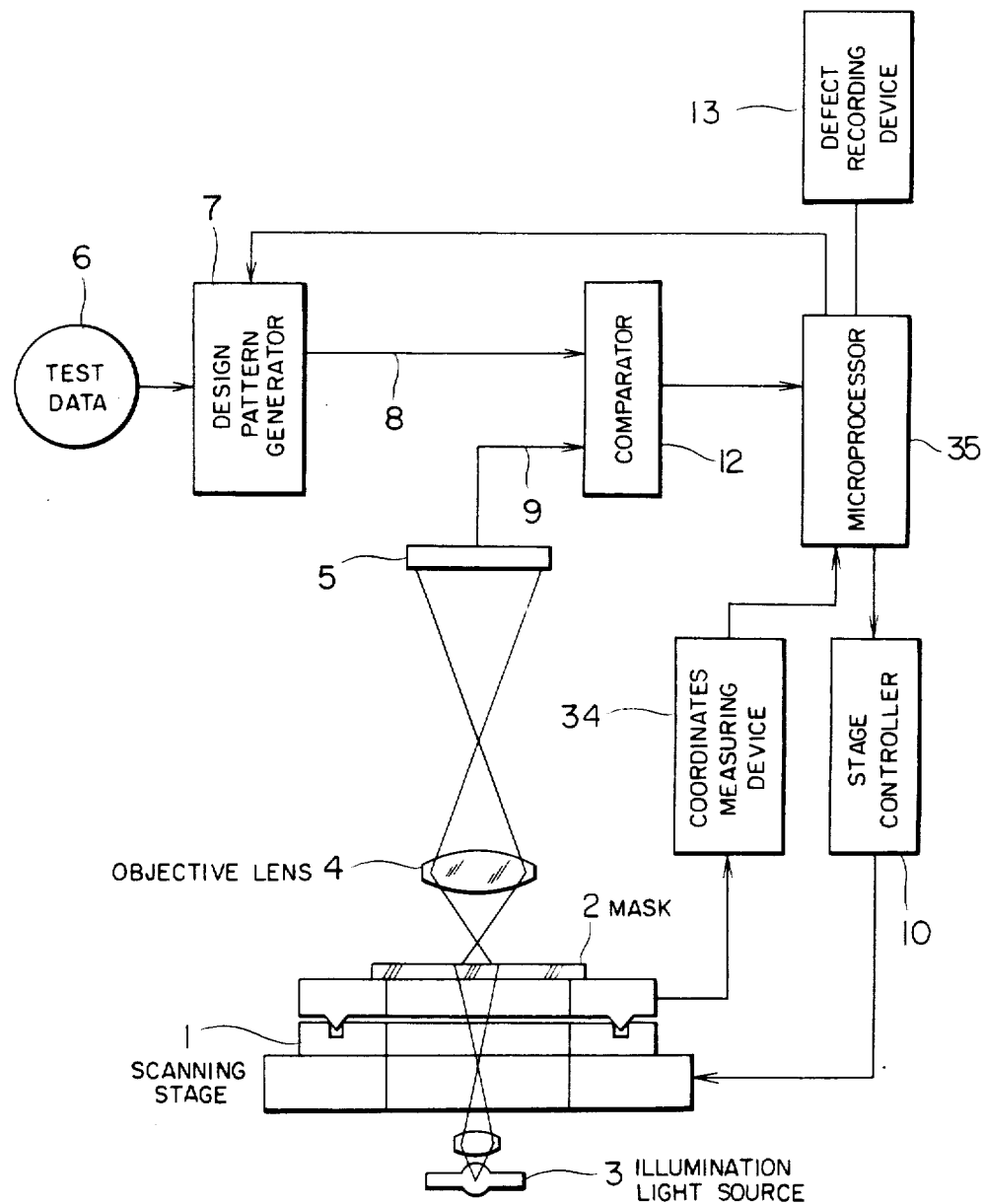

Referring to FIG. 9, a mask 2 to be inspected is disposed on a XY-stage 1. The movement of the XY-stage in the X- and Y-directions is controlled by a stage controller 10. The amount of movement (or displacement) is measured by a coordinate measuring device 34. In addition, the mask 2 is illuminated by an illumination light source 3 disposed below the mask 2. The pattern image of the mask 2 generated under illumination is projected onto an imaging device 5 for detection through an objective lens 4 disposed above the mask 2. The design data used in the manufacturing of the mask 2 are converted to a test data 6 of a format suited for the test or inspection, which data in turn are utilized for generating a reference pattern signal 8 corresponding to the mask 2 through a design pattern generator 7. The reference pattern signal 8 thus corresponds to the test pattern signal 9 produced by the imaging device 5. Synchronization in reading both signals is controlled by inputting the coordinate values of the XY-stage 1 derived from the coordinate measuring device 34 into a microprocessor 35 as command values for generating the design pattern. The design pattern signal 8 and the test pattern signal 9 are compared with each other through a comparator 12. When a defect is detected to be present in accordance with a predetermined defect detecting algorithm, the microprocessor 35 identifies the coordinates and the type or sort of the defect, the resultant data being recorded by a defect recording device 13 to be utilized later on for correction of the defect.

Figure 10:
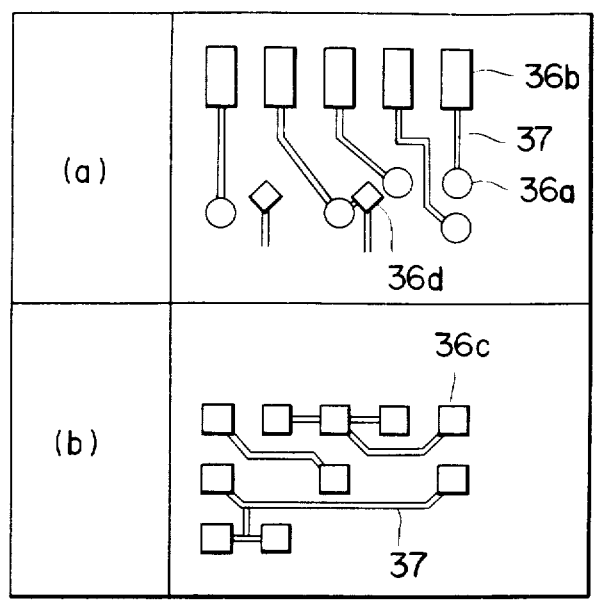

FIG. 10 is a view illustrating, by way of example, configurations of patterns printed on substrates which provide objects to be selectively tested or inspected by the second pattern test or inspection apparatus to which the invention is applied. In the patterns under consideration, electrode patterns referred to as pads are disposed on lattice points with a constant distance therebetween. More specifically, the electrode patterns include circular patterns 36a, rectangular patterns 36b, and square patterns 36c and 36d. Interconnections are formed between or among the electrode patterns or pads through signal lines 37.

Figure 11:
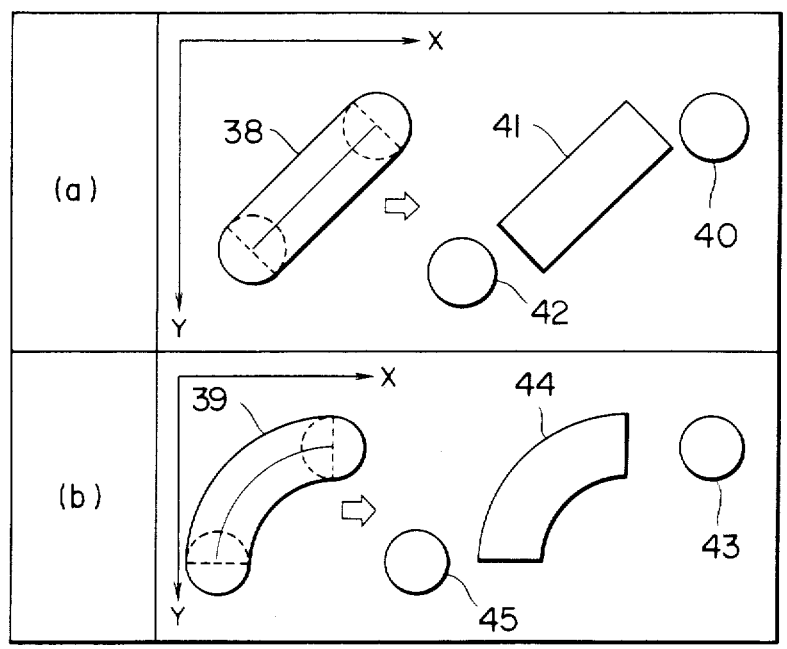

The present invention is concerned with the design pattern generator as in the case of the first pattern test apparatus described hereinbefore. More particularly, referring to FIG. 11, a pattern 38 shown at (a) is decomposed into pattern elements including a start circle 40, a rectangular movement section 41 and an end circle 42. On the other hand, a pattern 17 shown at (b) in FIG. 11 is decomposed into pattern elements including a start circle 43, a circular arc movement section 44 and an end circle 45. These pattern elements are combined into the pattern 38 or 39 respectively.

Figure 12:
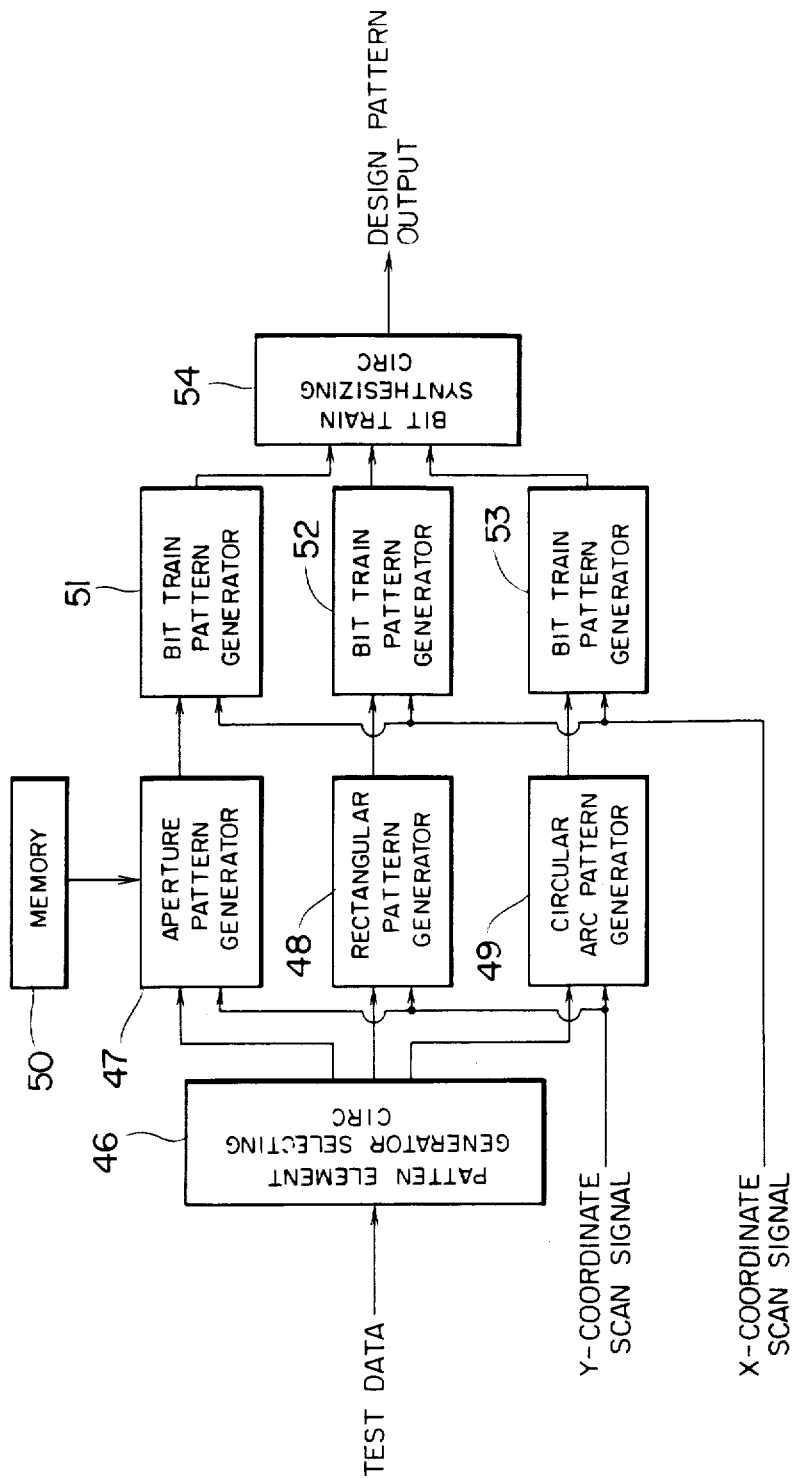

FIG. 12 is a view showing an arrangement of the design pattern generator 7 (FIG. 9). Referring to the figure, the test data is obtained as the result of conversion of the design pattern data to a format suited for the test or inspection. In the case of the pattern exemplified in FIG. 11, the test data include the data indicative of the circle of the start circle 40 and the end circles 42 as well as coordinate information of the start point and end point, and additionally, a rectangle code and information of the four apexes of the rectangular pattern 41. Concerning the array of these data, description made hereinbefore applies same as set forth above.

Pattern data inputted to a pattern element generator selecting circuit 46 are supplied to one of an aperture pattern generator 47, a rectangular pattern generator 48 and a circular arc pattern generator 49 in dependence on the pattern data information indicative of the geometrical form of the pattern. The aperture pattern generator 47 is adapted to generate a circular or rectangular pattern. In the case of the examples shown in FIG. 11 at (a) and (b), the generator 47 generates the start circles 40, 43, and the end circles 42, 45. The rectangular pattern generator 48 shown in FIG. 12 is adapted to generate the rectangular pattern 41, while the circular arc pattern generator 49 generates the circular arc pattern 44 shown in FIG. 11 at (b). The coordinates of the relative position of the aperture pattern (the position coordinates of external form constituting a circle in the case of the circular pattern) are previously stored in the memory 50 shown in FIG. 12. The Y-coordinate information (Y-coordinate scan signal) of the XY-stage 1 is inputted to the pattern generators 47, 48 and 49, respectively. On the other hand, in order to allow the pattern to be generated through the raster scan, the outputs of the pattern generators 47, 48 and 49 are inputted to bit train pattern generators 51, 52 and 53, respectively, together with the X-coordinate information (X-coordinate scan signal). A bit train synthesizing circuit 54 is implemented in the form of a logic OR circuit so that the outputs of the bit train pattern generators 51, 52 and 53 are logically ORed by the circuit 54 to be outputted as the design pattern.

Next, the aperture pattern generator 47, the rectangular pattern generator 48 and the arcuate pattern generator 49 will be explained in more detail.

Figure 13:
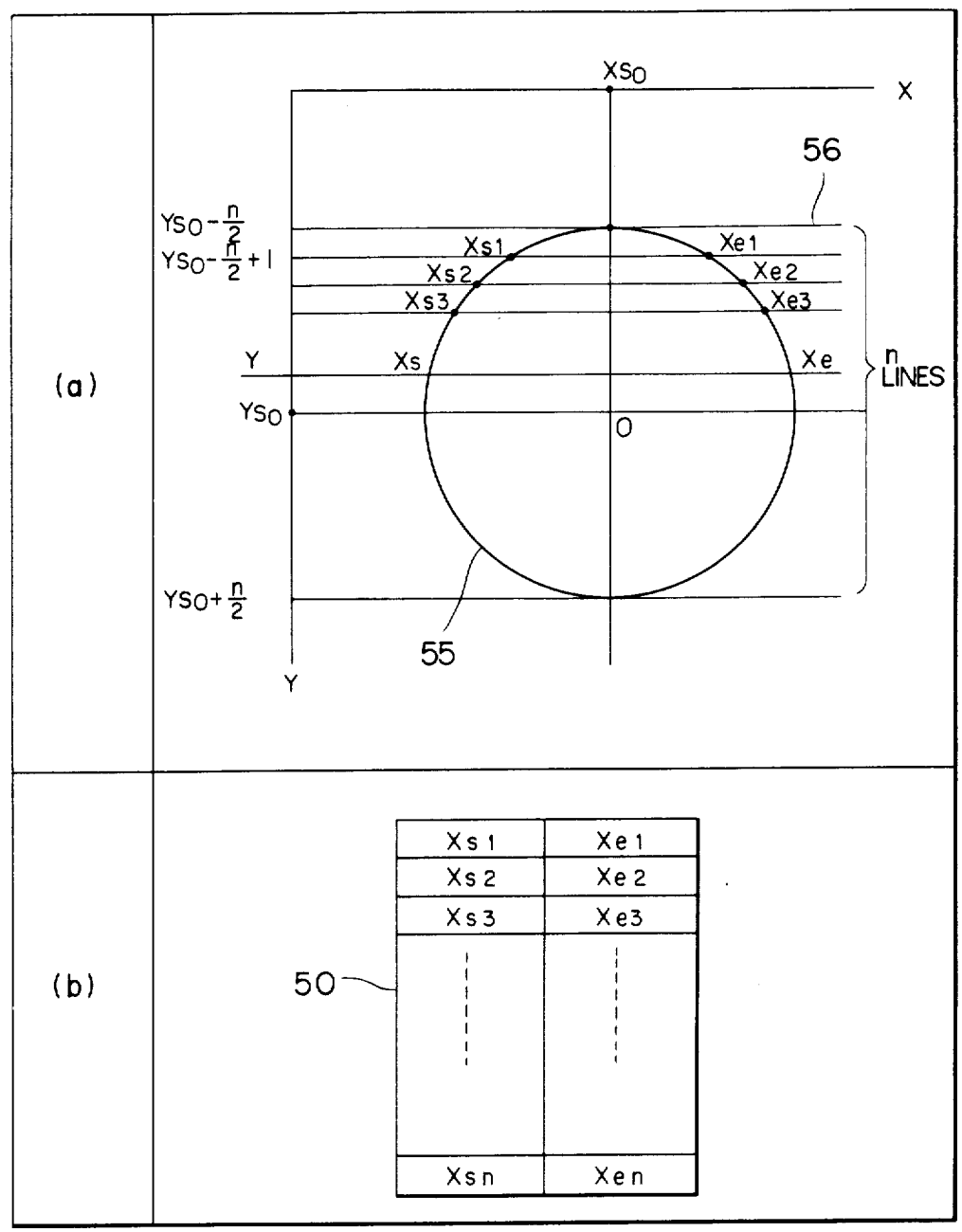

Considering the circular pattern 55 shown in FIG. 13 at (a), by way of example, information of the start points Xsi (i=1~n) and the end points Xei (i=1~n) of the individual scanning lines are stored in the memory 50 shown in FIG. 12 in terms of relative coordinates to the center Xso of the pattern, as illustrated at (b) in FIG. 13. More particularly, when the start point of the pattern under consideration lying on the scanning line Y is represented by Xs, it applies valid that Xs=Xsi+Xso. Similarly, representing the end point by Xe, then Xe=Xei+Xso (where i=1~n). Referring to FIG. 13 at (a), it is so arranged that the points Xs and Xe are generated when Y lies in the range given by $$Yso-(n/2)+i \leq Y \leq Yso+(n/2)+i (i=1\sim n)$$

Figure 14:
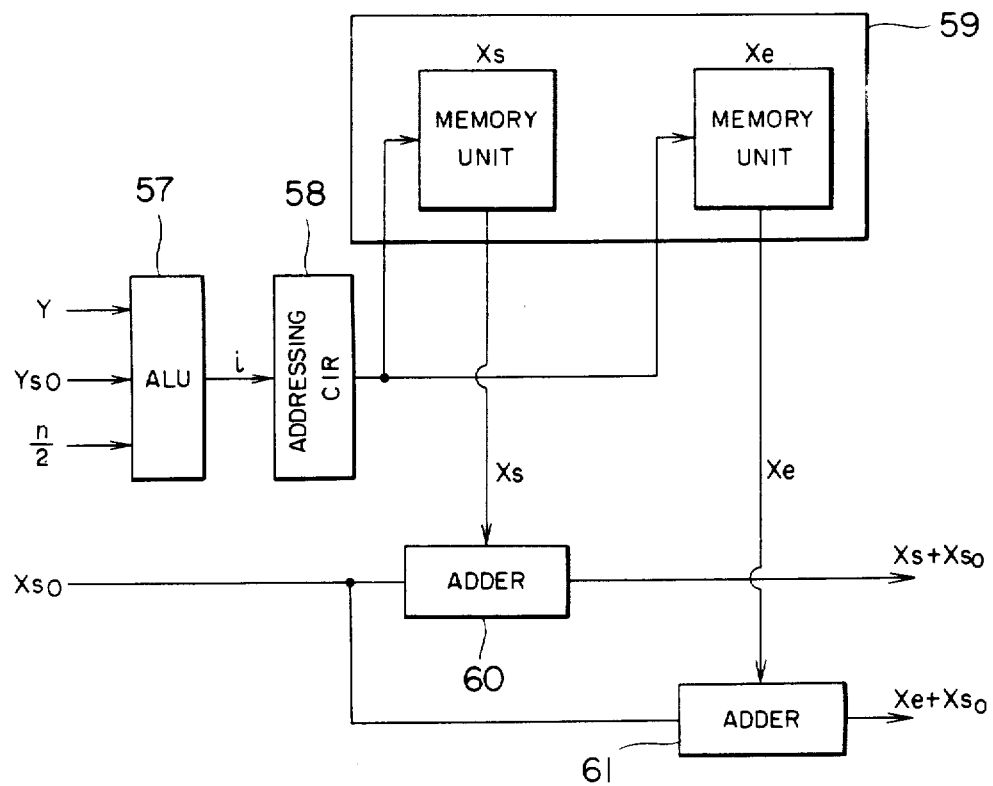

FIG. 14 shows a circuit arrangement of the aperture pattern generator 47 (FIG. 12) in detail. Referring to the figure, in response to the input of the coordinate value Y of the XY-stage, the center coordinate information Xso, Yso of the circular pattern derived from the pattern data and a constant n/2 determined by the size of the circular pattern, an arithmetic unit (ALU) 57 determines the address i of Xs and Xe. An addressing circuit 58 decides whether the address i is incremented by one scan upon every change of the Y-coordinate. When the address i is incremented, the coordinates information Xs and Xe are outputted from the memory 59. To make the coordinate outputs correspond to the absolute coordinates on the mask, they are added with the center coordinate data Xso of the circular pattern through addresses 60 and 61, respectively.

Figure 15:
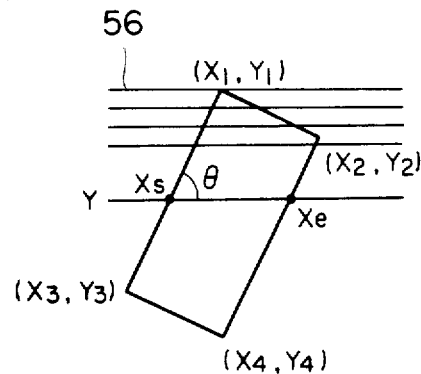

Next, the rectangular pattern generator 48 (FIG. 12) will be described. FIG. 15 shows an example of the rectangular pattern. In the case of the rectangular pattern, the coordinate data of four apexes (X1, Y1), X2, Y2), (X3, Y3) and (X4, Y4) are derived from the input pattern data in FIG. 15. Accordingly, it is possible to determine the start point Xs and the end point Xe of the pattern on the scanning line by determining an angle $\theta$ formed by the rectangle and the scanning line. In that case, the angle $\theta$ is given by $$\theta = \tan^{-1} \frac{Y_3 - Y_1}{X_3 - X_1}$$

The start points Xs and the end point Xe on the scanning line 56 can be determined as follows:

$$Y_1 \leq Y \leq Y_3$$

$$X_s = X_1 - (Y - Y_1) \times \cot \theta$$

$$Y_3 \leq Y \leq Y_4$$

$$X_s = X_3 - (Y - Y_3) \times \tan \theta$$

$$Y_1 \leq Y \leq Y_2$$

$$X_e = X_1 - (Y - Y_1) \times \tan \theta$$

$$Y_2 \leq Y \leq Y_4$$

$$X_e = X_2 - (Y - Y_2) \times \cot \theta$$

where Y represents the coordinate values of the XY-stage.

Figure 16:
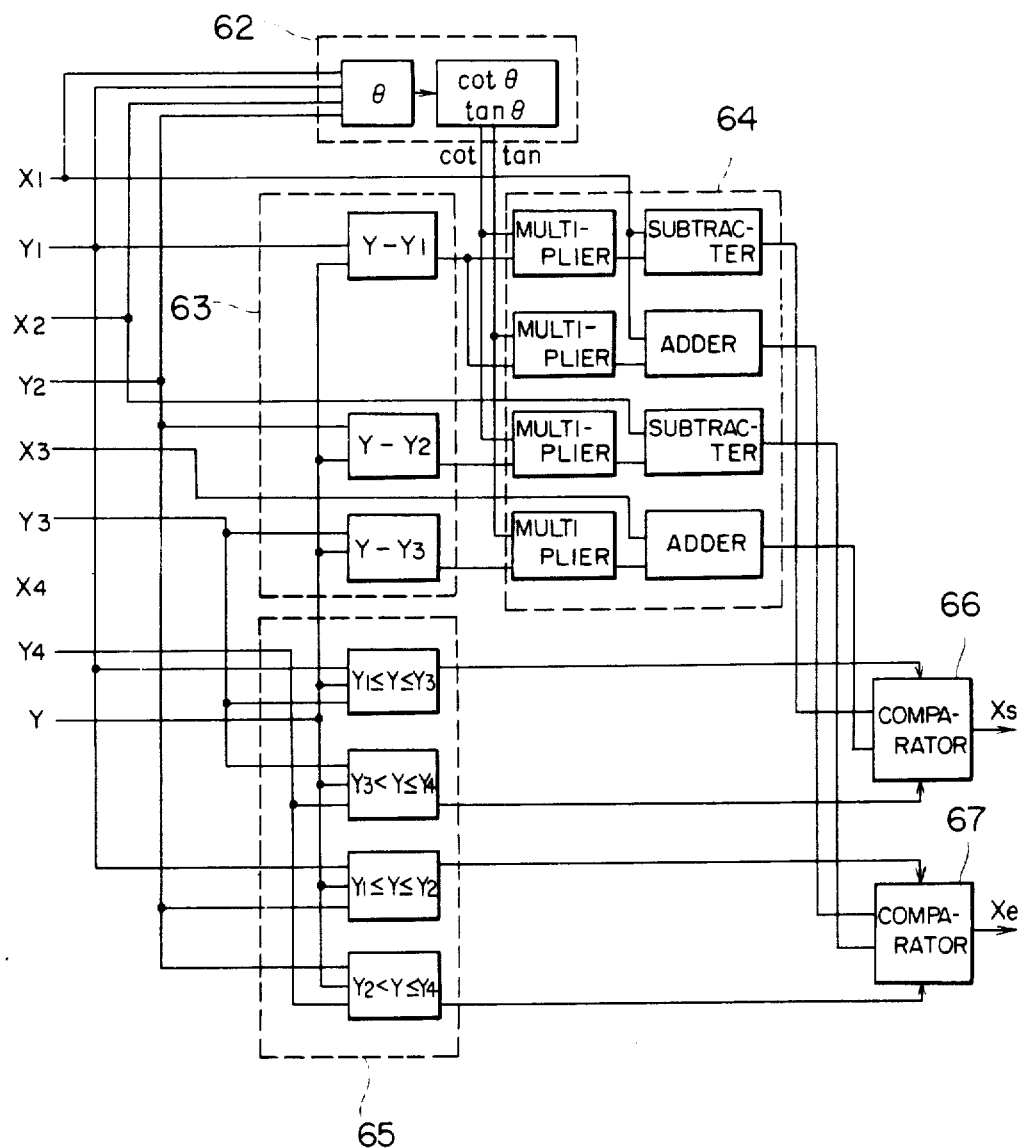

FIG. 16 shows a circuit arrangement of the rectangular pattern generator 48 (FIG. 12) in detail. Upon inputting of the apex coordinates $(X_1, Y_1)$, $(X_2, Y_2)$, $(X_3, Y_3)$ and $(X_4, Y_4)$ together with the Y-coordinate of the XY-stage, an arithmetic unit (ALU) determines arithmetically the values $\theta$, $\tan \theta$ and $\cos \theta$ in accordance with the aforementioned expressions. An arithmetic unit (ALU) 63 determines (Y−Y1), (Y−Y2) and (Y−Y3). The outputs of the ALUs 62 and 63 are inputted to an arithmetic unit 64 for determining the start and end points Xs and Xe. Further, the coordinate value of Y is determined by a comparator 65. On the basis of the output of the comparator 65, a comparator 66 selects the start point data Xs to be outputted. Simultaneously, a comparator 67 selects the end point Xe on the basis of the output of the comparator 65.

Next, the circular arc pattern generator 49 (FIG. 12) will be described in detail.

Figure 17:
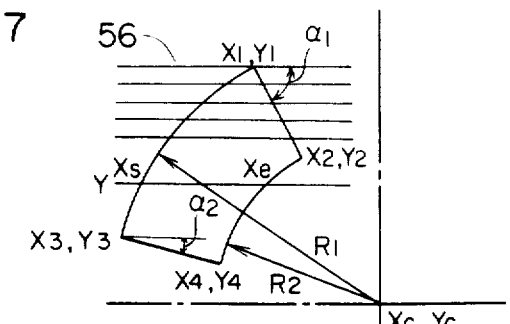

FIG. 17 is a view illustrating an example of the circular arc pattern. In the case of the circular arc pattern, the apex coordinates (X1, Y1), (X2, Y2), (X3, Y3) and (X4, Y4) and the center coordinates (Xc, Yc) of the circular arc can be derived from the pattern data illustrated in FIG. 17. On the basis of these data or information, the outer diameter R1 and the inner diameter R2 of the circular arc as well as angles $\alpha_1$ and $\alpha_2$ formed between the scanning line 56 and a linear segments, respectively, are determined in accordance with $$R_1 = \sqrt{(X_1 - X_c)^2 + (Y_1 - Y_c)^2}$$

-continued $$R_2 = \sqrt{(X_2 - X_c)^2 + (Y_2 - Y_c)^2}$$

$$\alpha_1 = \tan^{-1} \frac{Y_2 - Y_1}{X_2 - X_1}$$

$$\alpha_2 = \tan^{-1} \frac{Y_4 - Y_3}{X_4 - X_3}$$

On the basis of these data, the pattern start point Xs and end points Xe on each of the scanning lines can be determined as follows:

$$Y_1 \leq Y \leq Y_3$$

$$X_s = X_c - \sqrt{R_1^2 - (Y - Y_c)^2}$$

$$Y_3 \leq Y \leq Y_4$$

$$X_s = X_3 + \cot \alpha_2 \times (Y - Y_3)$$

$$Y_1 \leq Y \leq Y_2$$

$$X_e = X_1 + \cot \alpha_1 \times (Y - Y_1)$$

$$Y_2 \leq Y \leq Y_4$$

$$X_e = X_c - \sqrt{R^2 - (Y - Y_c)^2}$$

where Y represents the coordinates of the XY-stage.

Figure 18:
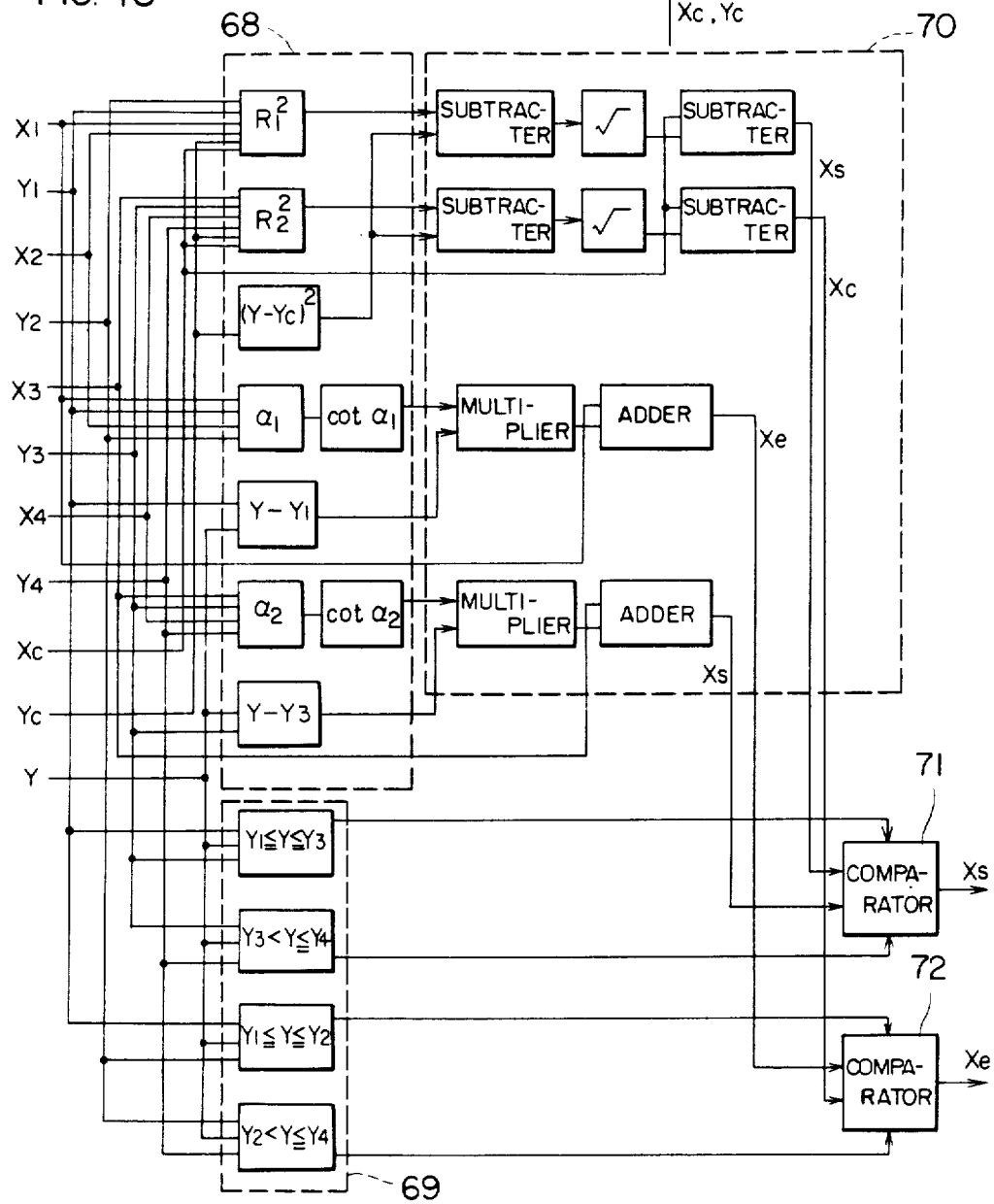

FIG. 18 is a view showing a circuit arrangement of the circular arc pattern generator 49 (FIG. 12) in detail. In response to the input of the apex coordinates (X1, Y1), (X2, Y2), (X3, Y3) and (X4, Y4) and the center coordinates (Xc, Yc) of the circular arc together with the Y-coordinate of the XY-stage, an arithmetic unit 68 determines arithmetically the values R1, R2, $\alpha_1$, $\alpha_2$ and others, while a comparator 69 determines the Y-coordinate. The output values of the arithmetic unit 68 are inputted to an arithmetic unit 70 for determining the start and end points Xs and Xe, while a comparator 71 selects the value of Xs on the basis of the outputs of comparators 69 and 70. In a similar manner, the comparator 72 selects the value of Xe.

The values of Xs and Xe outputted from the aperture pattern generator 47 (FIG. 12), the rectangular pattern generator 48 and the circular arc pattern generator 49 are then inputted to the associated bit train generators 51, 52 and 53, respectively. Each of these bit train pattern generators 51, 52 and 53 may be constituted by, for example, an R-S flip-flop so that upon coincidence of the X-coordinate with Xe, logic "1" is outputted, while logic "0" is outputted when the X-coordinate coincides with Xe.

The bit train synthesizing circuit 54 may be implemented in the form of a logic OR circuit for logically ORing the outputs of the bit train pattern generators 51, 52 and 53. With the arrangement described above, the design pattern can be outputted in synchronism with the raster scan to thereby generate the patterns 37 and 39 illustrated in FIG. 11 at (a) and (b), respectively.

As will be appreciated from the foregoing description, any given pattern can be generated through the raster scan method according to the teaching of the invention, whereby the plotting of patterns can be realized freely, which has been heretofore impossible. Further, because the pattern can be generated with a reduced amount of data without increasing the memory capacity, inspection or test of depicted or plotted patterns can be accomplished at a high speed with an enhanced reliability.

We claim:

1. A pattern test apparatus comprising:
   (a) imaging means for providing an image of an object under test by scanning said object using light in X-axis and Y-axis directions and for outputting a digital video signal of said image;
   (b) detecting means for detecting X and Y coordinates of said imaging means as said image is being scanned;
   (c) a design pattern generator including;

converting means for converting design data including specific position coordinates of an aperture pattern used in manufacturing said object under test and specific position coordinates of a starting point and an end point of said aperture pattern, into test data in accordance with a predetermined order of patterns on said object under test, said test data including aperture data which contains a code indicating a pattern type and specific position coordinates of said aperture pattern, rectangular data which contains a code indicating a rectangular pattern and coordinate data corresponding to predetermined positions on said rectangular pattern, a memory for storing at least one of said aperture patterns as two dimensional image data with respect to said specific position coordinates thereof, aperture pattern generating means for reading out of said memory said two dimensional image data, for converting said two dimensional image data into aperture pattern generating area data based on said specific position coordinates and for generating a bit train pattern corresponding to said aperture pattern generating for each scanning line in an X axis direction when said X and Y coordinates detected by said detecting means correspond to said converted aperture pattern generating area data, rectangular pattern generating means including a first arithmetic and comparing circuit for calculating starting point coordinates and end point coordinates of each side of said rectangular pattern based on inputted coordinate data representing said rectangular pattern and for generating a bit train pattern corresponding to said rectangular pattern for each scanning line in the X axis direction when said X and Y coordinates detected by said detecting means correspond to said starting point coordinates and end point coordinates calculated by said first arithmetic and comparing circuit, selecting means for selecting said aperture pattern generating means and said rectangular pattern generating means based on the order of said aperture data and said rectangular data designated by said converting means and for inputting said aperture data and said rectangular data to said aperture pattern generating means and said rectangular pattern generating means respectively, and a bit train synthesizing circuit for synthesizing a design pattern through a logic operation of said bit train pattern corresponding to said aperture pattern obtained from said aperture pattern generating means and said rectangular pattern obtained from said bit train pattern corresponding to said rectangular pattern generating means; and (d) comparing means for comparing said digital video signal obtained from said imaging means with said design pattern obtained from said design pattern generator.

2. A pattern test apparatus according to claim 1, wherein said design pattern generator further includes:
   a second arithmetic and comparing circuit for calculating starting point coordinates of a starting side of a circular pattern and end point coordinates of an end side of said circular pattern; and circular arc pattern generating means for generating a bit train pattern corresponding to said circular arc pattern for each scanning line in the X axis direction when said X-Y coordinates detected by said detecting means correspond to said starting point coordinates and said end point coordinates calculated by said second arithmetic and comparing circuit, said test data generated by said converting means including circular arc data having a code indicating said circular arc pattern, coordinates of apex points of the circular arc and center coordinates of the circular arc for said circular arc pattern, said selecting means additionally selects said circular arc pattern generating means, and said bit train synthesizing circuit additionally synthesizes said bit pattern corresponding to said circular arc pattern obtained from said circular pattern generating means.

3. A pattern test apparatus according to claim 1, wherein said object under test is an object having a wiring pattern for a printed substance.

4. A pattern test apparatus according to claim 1, wherein image data having reference coordinates corresponding to said specific position coordinates stored in said memory includes coordinates of a starting point and an end point of each scanning line extending over an area of said aperture pattern in the Y-axis direction.

5. A pattern test apparatus according to claim 3, wherein said specific position coordinates are selected to be center coordinates.

6. A pattern test apparatus according to claim 3, wherein the coordinate data corresponding to said predetermined positions on said rectangular pattern are selected to be coordinates of the apex points thereof.

* * * * *